(12) United States Patent
Cea et al.

(10) Patent No.: US 11,676,965 B2
(45) Date of Patent: Jun. 13, 2023

(54) STRAINED TUNABLE NANOWIRE STRUCTURES AND PROCESS

(71) Applicant: INTEL CORPORATION, Santa Clara, CA (US)

(72) Inventors: Stephen M. Cea, Hillsboro, OR (US);
Tahir Ghani, Portland, OR (US);
Anand S. Murthy, Portland, OR (US);
Biswajeet Guha, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 857 days.

(21) Appl. No.: 16/146,219

(22) Filed: Sep. 28, 2018

(65) Prior Publication Data

US 2020/0105755 A1    Apr. 2, 2020

(51) Int. Cl.
*H01L 27/092*    (2006.01)
*H01L 29/51*    (2006.01)
*H01L 29/165*    (2006.01)
*H01L 29/08*    (2006.01)
*H01L 29/10*    (2006.01)
(Continued)

(52) U.S. Cl.
CPC ...... *H01L 27/0924* (2013.01); *H01L 21/3086* (2013.01); *H01L 29/0673* (2013.01); *H01L 29/0847* (2013.01); *H01L 29/1033* (2013.01); *H01L 29/165* (2013.01); *H01L 29/41791* (2013.01); *H01L 29/4232* (2013.01); *H01L 29/517* (2013.01); *H01L 29/6681* (2013.01); *H01L 29/66545* (2013.01); *H01L 29/785* (2013.01); *H03K 19/20* (2013.01)

(58) Field of Classification Search
CPC .................... H01L 29/42392; H01L 29/66439
See application file for complete search history.

(56) References Cited

U.S. PATENT DOCUMENTS 9,224,810 B2    12/2015 Kim et al.
9,871,140 B1 *    1/2018 Balakrishnan ........ H01L 27/092
(Continued)

FOREIGN PATENT DOCUMENTS

WO    2018/125120    7/2018

*Primary Examiner* — Farun Lu
(74) *Attorney, Agent, or Firm* — Schwabe, Williamson & Wyatt P.C.

(57) ABSTRACT

Fabrication techniques for NMOS and PMOS nanowires leveraging an isolated process flow for NMOS and PMOS nanowires facilitates independent (decoupled) tuning/variation of the respective geometries (i.e., sizing) and chemical composition of NMOS and PMOS nanowires existing in the same process. These independently tunable degrees of freedom are achieved due to fabrication techniques disclosed herein, which enable the ability to individually adjust the width of NMOS and PMOS nanowires as well as the general composition of the material forming these nanowires independently of one another. In the context of nanowire based semiconductors, in which NMOS and PMOS nanowires are incorporated as channel, drain and source regions respectively for NMOS and PMOS nanowire transistors, independent tuning of the NMOS and PMOS nanowires facilitates independent tuning of short-channel effects, gate drive, the width of the transistor dead space capacitance, strain and other performance related characteristics of associated NMOS and PMOS nanowire transistors.

22 Claims, 7 Drawing Sheets

SEE FIG. 1b

(51) Int. Cl.
*H01L 29/06* (2006.01)
*H01L 21/308* (2006.01)
*H01L 29/66* (2006.01)
*H01L 29/417* (2006.01)
*H01L 29/423* (2006.01)
*H01L 29/78* (2006.01)
*H03K 19/20* (2006.01)

(56) References Cited

U.S. PATENT DOCUMENTS

| | | |
|---|---|---|
| 9,905,650 B2 | 2/2018 | Cea et al. |
| 11,152,510 B2* | 10/2021 | Zhang ................... B82Y 10/00 |
| 2016/0260802 A1 | 9/2016 | Glass et al. |
| 2018/0114727 A1* | 4/2018 | Rodder ........... H01L 21/823828 |
| 2018/0151452 A1* | 5/2018 | Doornbos ......... H01L 29/66469 |

* cited by examiner

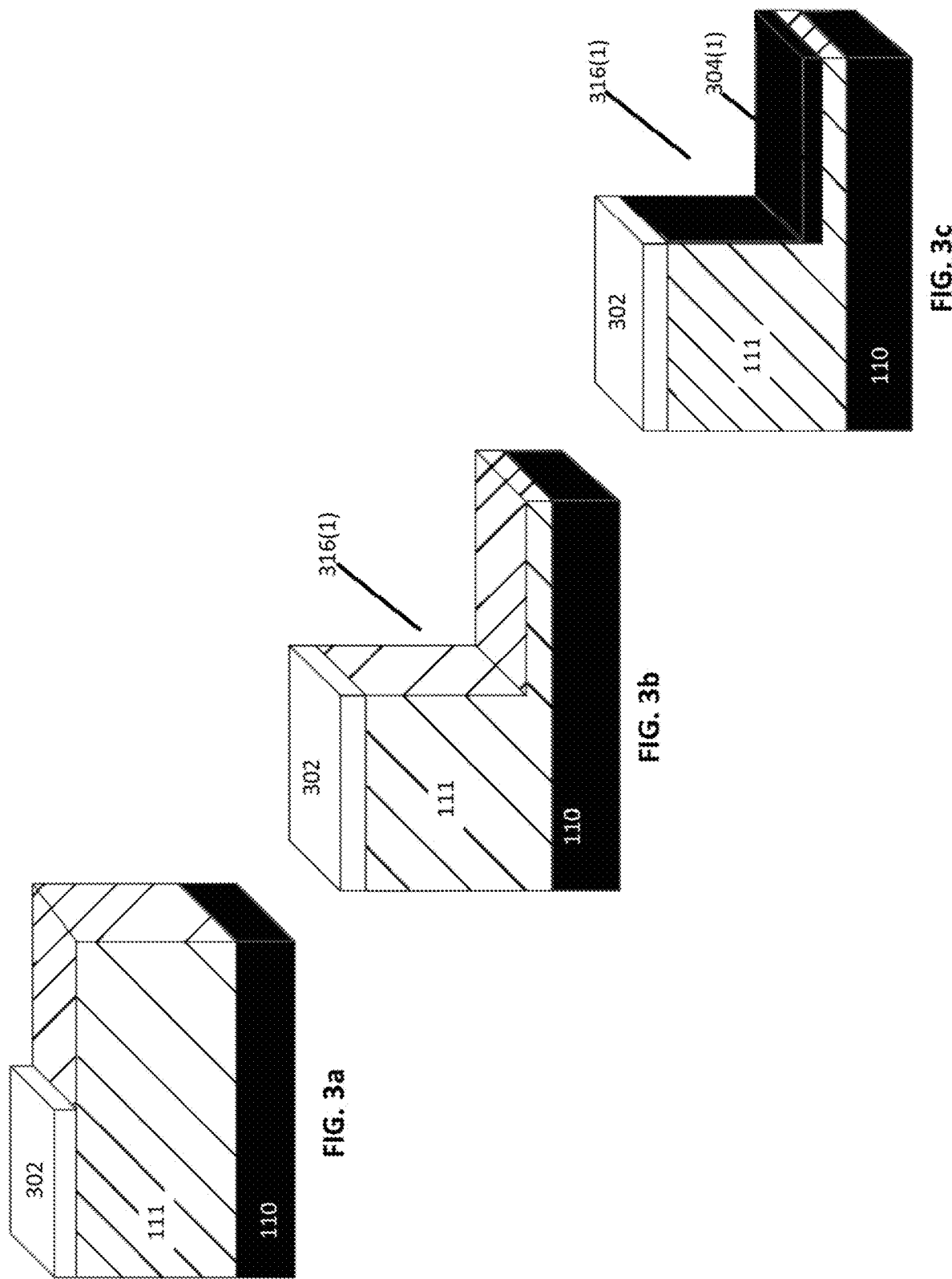

STRAINED TUNABLE NANOWIRE STRUCTURES AND PROCESS

BACKGROUND

Planar transistor technologies such as CMOS ("Complementary Metal Oxide Semiconductor") have evolved in accordance with Moore's law toward denser designs (i.e., larger number of transistors per unit area). Traditionally, this evolution has been achieved by scaling the dimensions of the individual transistors and associated parameters to accommodate the increasing densities. However, reduction of transistor size is limited by the practicalities of reliable fabrication techniques for achieving practical yield as well as intrinsic device performance barriers arising from the underlying physics of such devices at small scales. For example, short channel effects ("SCEs") play a major role in device performance as transistors are scaled to smaller and smaller dimensions.

In order to overcome the scaling barriers for planar classical devices as the device dimensions are reduced into the nanoscale range (nanoscale CMOS), research has focused on 3D designs such as the FinFET ("Fin Field Effect Transistor"), which may utilize two or three gates and an ultra-thin body ("UTB") to control some of the performance impediments imposed by SCEs.

Recent approaches have focused on developing 3D transistors using one or more nanowires or nanoribbons to serve as channel, source and drain regions. The channel is then fully enclosed in a wrap-around gate structure. In these architectures, each of a set of nanowires arranged in a stack may provide a respective channel, source and drain region (or may be electrically coupled to a common source/drain region). The nanowires may then be switched from a non-conducting to conducting state (channel inversion) by applying an appropriate voltage to the gate. These 3D devices may also incorporate strained nanowires to improve carrier mobility. For example, one approach provides a dual-strained nanowire structure comprising an NMOS semiconductor device utilizing a plurality of NMOS nanowires whose conductance is controlled by a first gate and a separate PMOS semiconductor device comprising a plurality of PMOS nanowires whose conductance is controlled by a second gate.

Known fabrication techniques for building NMOS nanowires and PMOS nanowires using different materials respectively for the NMOS and PMOS nanowires in the same process utilizes a top down fabrication process where NMOS and PMOS channel material is layered on a base substrate in an alternating fashion. The stack of NMOS and PMOS material is then etched into multiple fins and, depending on whether NMOS or PMOS nanowires are desired, alternating layers (i.e., PMOS channel material to from NMOS nanowires and vice versa) are removed from each fin to form the NMOS and PMOS nanowires. These known fabrication techniques impose an inherent coupling/dependency in the geometries of NMOS and PMOS nanowires, which manifests in the inability to tune each an NMOS nanowire transistor independently of a PMOS nanowire transistor with respect to SCEs, gate drive, transistor dead space capacitance, strain and other performance related characteristics.

Thus, a fabrication process for generating NMOS and PMOS nanowire devices is required that allows for the independent tuning of the NMOS and PMOS nanowires while maintaining the nanowire uniformity and improving the efficiency of the devices.

BRIEF DESCRIPTION OF THE DRAWINGS

FIG. 3a depicts a first portion of a deep-well process flow (DWPF) according to one embodiment of the present disclosure.

FIG. 3b depicts a second portion of a DWPF according to one embodiment of the present disclosure.

FIG. 3c depicts a third portion of a DWPF according to one embodiment of the present disclosure.

DETAILED DESCRIPTION

Figure 1A:
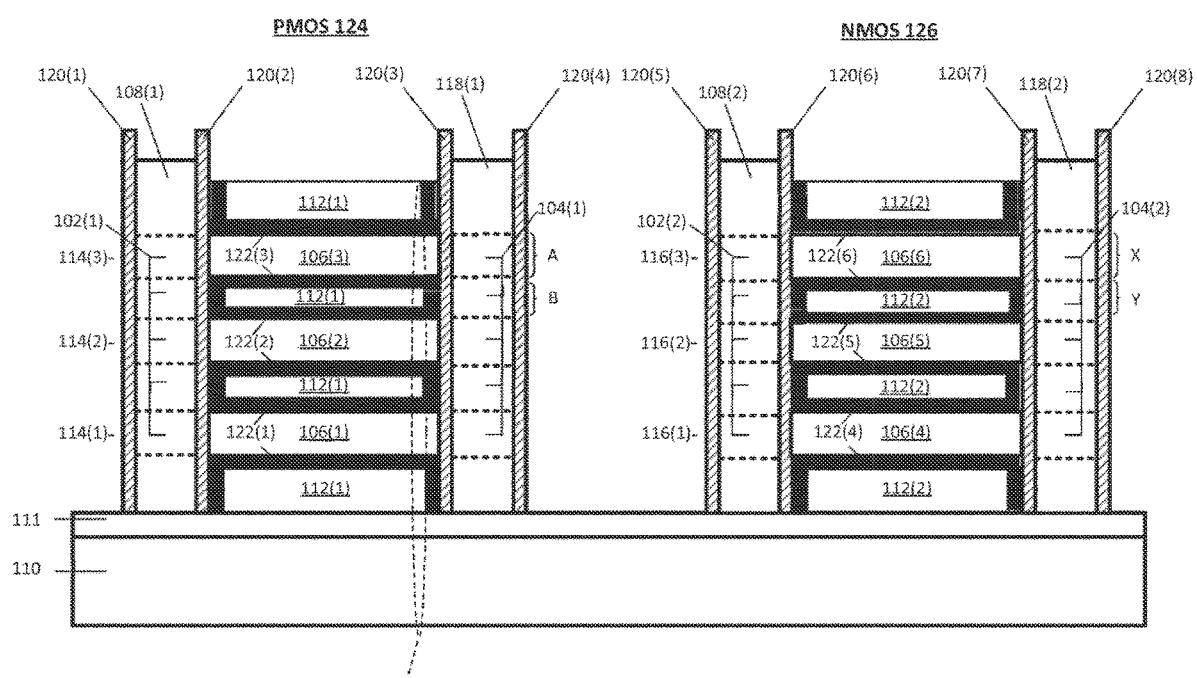
FIG. 1a depicts a 2D cross-section of a semiconductor device comprising individually tunable stacked NMOS and PMOS nanowire devices according to one embodiment of the present disclosure.

According to one embodiment of the present disclosure, fabrication techniques for NMOS and PMOS nanowires facilitate engineering of NMOS nanowire geometries, chemical composition and other attributes independent of associated PMOS nanowire attributes for NMOS and PMOS nanowire stacks co-existing in the same process. For the purposes of this disclosure, the term geometry refers to dimensions of individual nanowires such as the nanowire width as well as other attributes such as the spacing between nanowires in a stack. As will be described herein, independently tunable NMOS and PMOS nanowire geometries can provide significant benefits in device engineering of NMOS and PMOS nanowire transistor devices. In some such embodiments, these benefits include elimination of sizing and spacing constraints between nanowires, increased independence of channel mobility engineering for NMOS and PMOS nanowires, and minimization of SCEs for both NMOS and PMOS nanowire devices existing in the same process. These independently tunable degrees of freedom with respect to NMOS and PMOS nanowire devices are achieved using fabrication techniques disclosed herein that enable the variation of the width, spacing, chemical composition and other attributes of NMOS nanowires in a first stack independently of PMOS nanowires in a second stack.

The independent tuning of NMOS and PMOS nanowire geometries enabled by techniques disclosed herein enables the independent tuning of performance characteristics of associated NMOS and PMOS nanowire transistors. That is, the fabrication techniques disclosed herein enable the decoupling of NMOS nanowire attributes from PMOS nanowire attributes such that the performance characteristics of NMOS nanowire transistors may be tuned independently of the performance characteristics of PMOS nanowire transistors. In particular, according to one embodiment of the present disclosure, independent tuning of NMOS and PMOS nanowires facilitates tuning of SCEs, gate drive, width of the transistor dead space capacitance, strain and other performance related characteristics of NMOS and PMOS nanowire transistors independently of one another.

According to one embodiment of the present disclosure, a semiconductor device is described that exhibits at least one NMOS nanowire transistor and at least one PMOS nanowire transistor. Each NMOS nanowire transistor comprises at least one NMOS nanowire stack while each PMOS nanowire transistor comprises at least one PMOS nanowire stack. Performance characteristics of NMOS nanowire stacks are independently tuned with respect to the performance characteristics of the PMOS nanowire stacks enabling the control of SCEs, gate drive, transistor dead space capacitance, strain and other performance related characteristics of the associated NMOS and PMOS nanowire transistors independently of one another.

According to one embodiment of the present disclosure, the tuning of NMOS and PMOS nanowire stacks independently of one another is achieved by employing a technique generally referred to herein as an isolated process flow (or "IPF"), whereby for some sections or portions of the process flow (other sections of the process flow may not necessarily employ an IPF) the NMOS nanowires and PMOS nanowires are fabricated independently of one another (or otherwise "isolated" from one another) by utilizing a fabrication method that isolates the respective NMOS and PMOS nanowire stacks from one another during fabrication. The IPF removes inherent coupling of the respective geometries and other characteristics of NMOS and PMOS nanowire device fabrication associated with previous approaches that arises from the duality between the NMOS channel layers and PMOS sacrificial layers and vice-versa. In particular, according to one embodiment of the present disclosure, an IPF may be implemented using a fabrication technique referred to herein as deep-well process flow ("DWPF").

Definitions

Traditionally, "nanowires" refer to wires with a broad range of geometries, where each of the four surfaces of the wire have the same lengths, while "nanoribbons" refer to wires with height/width aspect ratios of less than 1 (the wire is wider than it is tall, like a pancake). For purposes of the present disclosure, the term "nanowire" will be utilized interchangeably with the understanding that any associated discussion applies both to the nanowire and nanoribbon geometries. Nanoribbons may be arranged in either a horizontal or vertical orientation.

For purposes of the present disclosure, the term "NMOS nanowire" or "n-type nanowire" generally refers to a nanowire with a p-type channel/intrinsic and n-type impurity or dopant for source and drain regions, whereby electrons comprise the majority carriers of electric charge while holes comprise the minority carriers of electric charge. Similarly, the term "PMOS nanowire" or "p-type nanowire" generally refers to a nanowire comprising a n-type channel/intrinsic and a p-type impurity or dopant for the source and drain regions, whereby holes are the majority carriers of electric charge while electrons comprise the minority carriers of electric charge. That is, in either case, an intrinsic semiconductor may be doped with the appropriate impurity doping to achieve either an n-type or p-type material.

According to some embodiments of the present disclosure, a plurality of nanowires referred to herein as a "nanowire stack" may collectively be incorporated into either an NMOS or PMOS nanowire device or nanowire transistor wherein each nanowire provides a channel, source and drain region, or a channel operatively coupled between a source and drain. According to some embodiments, a nanowire transistor or nanowire semiconductor device may comprise multiple stacks of either NMOS or PMOS nanowires depending on whether the nanowire transistor is an NMOS or PMOS nanowire transistor respectively. Each nanowire stack may comprise one or more nanowires of either NMOS or PMOS material arranged in a vertical orientation. According to one embodiment of the present disclosure, rather than configuring each nanowire with a discrete source and drain region, a common source region and a common drain region may be fabricated to which each nanowire is electrically coupled.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium, Boron, Arsenic or Phosphorus) or the same dopants but at differing concentrations.

According to some embodiments, a Si/SiGe material process may be utilized. However, according to alternative embodiments, other materials such as III/V materials may be utilized.

Note that the use of "source/drain" herein is simply intended to refer to a source region or a drain region or both a source region and a drain region. To this end, the forward slash ("/") as used herein means "and/or" unless otherwise specified and is not intended to implicate any particular structural limitation or arrangement with respect to source and drain regions, or any other materials or features that are listed herein in conjunction with a forward slash.

FIG. 1a depicts a first 2D cross-section of a semiconductor device comprising individually tunable stacked n-type and p-type nanowire devices according to one embodiment of the present disclosure. As shown in FIG. 1a, semiconductor device 100 further comprises PMOS nanowire device 124 and NMOS nanowire device 126, both disposed over buffer layer 111. Buffer layer 111 itself is disposed over a common substrate layer 110. Note that the arrangement shown in FIG. 1a is not to scale. The devices shown therein would typically be thinner than the buffer shown, which itself is thinner than the substrate. Furthermore, the source/drain regions are not drawn to scale. For example, according to some embodiments the substrate is on order of 700 microns, the buffer is several microns and the devices are on order of 10 nm.

According to one embodiment substrate layer 110 comprises silicon (e.g., bulk silicon substrate or silicon layer) and buffer layer 111 may comprise, for example, rSiGe ("relaxed silicon germanium"). According to one embodiment of the present disclosure, rSiGe may comprise 20-50%. According to one embodiment of the present disclosure, NMOS may comprise sSi and PMOS may comprise sSiGe with Ge % of 40-100%. As will be understood, tensile strain may be introduced into an n-type nanowire to improve the inherent electron mobility. Similarly, compressive strain may be introduced into a p-type nanowire to improve the inherent hole mobility. The terms "sSi" ("strained silicon") and "sSiGe" ("strained silicon germanium") will respectively refer to strained silicon and strained silicon germanium respectively, which according to some embodiments, respectively function as channel material and sacrificial material for an NMOS nanowire and vice-versa for a PMOS nanowire. That is, during fabrication of an NMOS nanowire stack, sSiGe with a high concentration of Ge functions as a sacrificial layer while sSi or sSiGe with a low concentration of Ge functions as an active layer that ultimately forms an NMOS nanowire channel region, according to some example embodiments. Conversely, for a PMOS nanowire stack, sSi or sSiGe with a low concentration of Ge functions as a sacrificial layer while sSiGe with a high concentration of Ge functions as channel material.

NMOS nanowire device 126 may comprise one or more vertically stacked NMOS nanowires (e.g., 116(1)-116(3)), which collectively comprise an NMOS nanowire stack. A portion of each nanowire 116(1)-116(3) functions as a channel region (106(4)-106(6)). According to one embodiment of the present disclosure NMOS nanowires 116(1)-116(3) may comprise sSi or sSiGe with a low concentration of Ge. Nanowires 116(1)-116(3) are surrounded by respective dielectric layers 122(4)-122(6), which are further surrounded by gate electrode 112(2). Each NMOS nanowire (e.g., 116(1)-116(3)) may be fabricated to include a respective source region 102(2) and respective drain region 104(2). Although FIG. 1 a depicts a common source region 102(2) and common drain region 104(2) for all NMOS nanowires 116(1)-116(3), it will be understood that in alternative embodiments, each NMOS nanowire 116(1)-116(3) may be configured to include respective isolated/discrete source 102 and drain 104 regions. According to some embodiments, the source/drain regions may be isolated wherein each nanowire has a separate source/drain region. According to some embodiments of the present disclosure, a common source/drain block is utilized that couples a plurality of nanowires.

As shown in FIG. 1a, source electrode 108(2) is electrically coupled to source region 102(2). Similarly, drain electrode 118(2) is electrically coupled to drain region 104(2). It will also be understood that NMOS nanowire device 126 may comprise any number of NMOS nanowire stacks. Thus, although FIG. 1a shows a single nanowire stack comprising three NMOS nanowires (116(1)-116(3)), according to alternative embodiments, two or more NMOS nanowire stacks may be incorporated into NMOS nanowire device 126.

PMOS nanowire device 124 is structured similarly to NMOS nanowire device 126 to comprise one or more vertically stacked PMOS nanowires (e.g., 114(1)-114(3)). According to one embodiment of the present disclosure PMOS nanowires 114(1)-114(3) may comprise sSiGe with a high concentration of Ge ranging up to 100% Ge. A portion of each PMOS nanowire 114(1)-114(3) operates as a channel region (106(1)-106(3)), which may be respectively surrounded by dielectric layers 122(1)-122(3) and further enclosed by a gate electrode 112(1). Each PMOS nanowire (e.g., 114(1)-114(3)) is fabricated to include a respective source region 102(1) and respective drain region 104(1). Although FIG. 1a depicts a common source region 102(1) and common drain region 104(1) for all PMOS nanowires 114(1)-114(3), it will be understood that in alternative embodiments, each PMOS nanowire 114(1)-114(3) may be configured to include respective isolated/discrete source and drain regions.

Further, as shown in FIG. 1a, source electrode 108(1) is electrically coupled to source region 102(1). Similarly, drain electrode 118(1) is electrically coupled to drain region 104(1). As previously mentioned with respect to NMOS nanowire device 126, it will also be understood that PMOS nanowire device 124 may comprise any number of PMOS nanowire stacks rather than a single stack as shown in FIG. 1a.

PMOS nanowire device 124 and NMOS nanowire device 126 each respectively further comprise respective spacers 120(1)-120(4) and 120(5)-120(8). The function of spacers 120(1)-120(8) will be described below. According to one embodiment of the present disclosure, spacers 120(1)-120(8) may comprise Si oxide, Si oxynitride, SiC/N/O with a goal of a lower k (dielectric constant).

Semiconductor device 100 exhibits tuning of performance characteristics of PMOS nanowire stack 114(1)-114(3) independently of performance characteristics NMOS nanowire stack 116(1)-116(3). Performance characteristics may include attributes such as geometries of the respective nanowire stacks (e.g., thickness and spacing), material composition and any other attributes. The decoupled tuning of NMOS and NMOS nanowire stacks exhibited by semiconductor device 100 provides for the tuning of the performance characteristics of PMOS nanowire device 124 independently of NMOS nanowire device 126 with respect to SCEs, gate drive, the width of the transistor dead space capacitance, strain and other performance characteristics.

As will be described in detail below, the decoupled tunability of NMOS device 126 with respect to PMOS nanowire device 124 is enabled by IPF techniques that isolate NMOS nanowire fabrication from PMOS nanowire fabrication. In particular, a DWPF, which is described in detail below, provides one embodiment of an IPF. By decoupling the dependencies between NMOS and PMOS nanowires during fabrication (which arise from the duality between NMOS and PMOS nanowire channel layers and sacrificial layers), the thickness, chemical composition and other attributes of each NMOS nanowire may be independently tuned with respect to the attributes of PMOS nanowires. The benefits of the decoupled tunability of NMOS 116 and PMOS 114 nanowires will be explained via several examples. In one example, the optimal spacing between two layers might be 7 nm while the optimal thickness of an NMOS nanowire might be 5 nm and a PMOS nanowire 6 nm. As another example, for a PMOS nanowire, it is may be desirable to utilize a higher Ge percentage in the range 50-70% in the channel material as compared to an NMOS nanowire device. However, when the film comprises a sacrificial layer for an NMOS device, a lower GE percentage in the range 10-30% generates a more abrupt profile, which facilitates the etching and controllability of the sacrificial layer. As will be understood, the difference in Ge concentration (by atomic percentage) between the rSiGe layer and the sSi layer formed thereon can determine the amount and type of stress caused in the sSi layer.

Figure 1B:
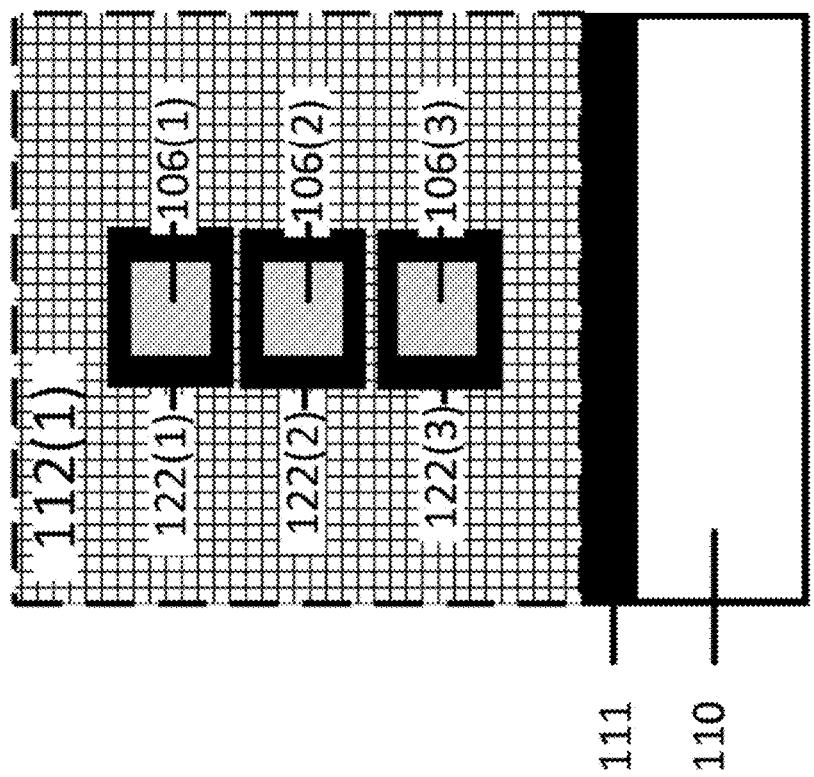
FIG. 1b depicts a 2D cross-section of a semiconductor device comprising individually tunable stacked NMOS and PMOS nanowire devices according to one embodiment of the present disclosure.

FIG. 1b depicts a rotated 2D cross-section of a semiconductor device comprising individually tunable stacked NMOS and PMOS nanowire devices according to one embodiment of the present disclosure. The view shown in FIG. 1b may be understood as the rotation of semiconductor device 100 around the y axis with the cross-section taken at the PMOS 124 nanowire channel regions 106(1)-(3).

In some embodiments, the dielectric layers 122(1)-122(6) and/or gate electrodes 112(1)-112(2) may include a multi-layer structure of two or more material layers or components. For instance, in one such embodiment, the dielectric layers 122(1)-122(6) are a bi-layer structure having a first dielectric material (e.g., silicon dioxide) in contact with the corresponding channel region and a second dielectric material (e.g., hafnium oxide) in contact with the first dielectric material, the first dielectric material having a dielectric constant that is lower than the dielectric constant of the second dielectric material. Likewise, the gate electrode structures 112(1) or 112(2) (or both) may include a central metal plug portion (e.g., tungsten) with one or more outer work function layers and/or barrier layers (e.g., tantalum, tantalum nitride, an aluminum-containing alloy), and/or a resistance reducing cap layer (e.g., copper, gold, cobalt, tungsten). In some embodiments, the dielectric layers 122(1)-122(6) and/or gate electrodes 112(1)-112(2) may include grading (increasing or decreasing, as the case may be) of the concentration of one or more materials therein.

Semiconductor device may be incorporated into a digital circuit, for example, to form a logic gate such as a NAND or NOR gate.

Fabrication Process

Figure 2:
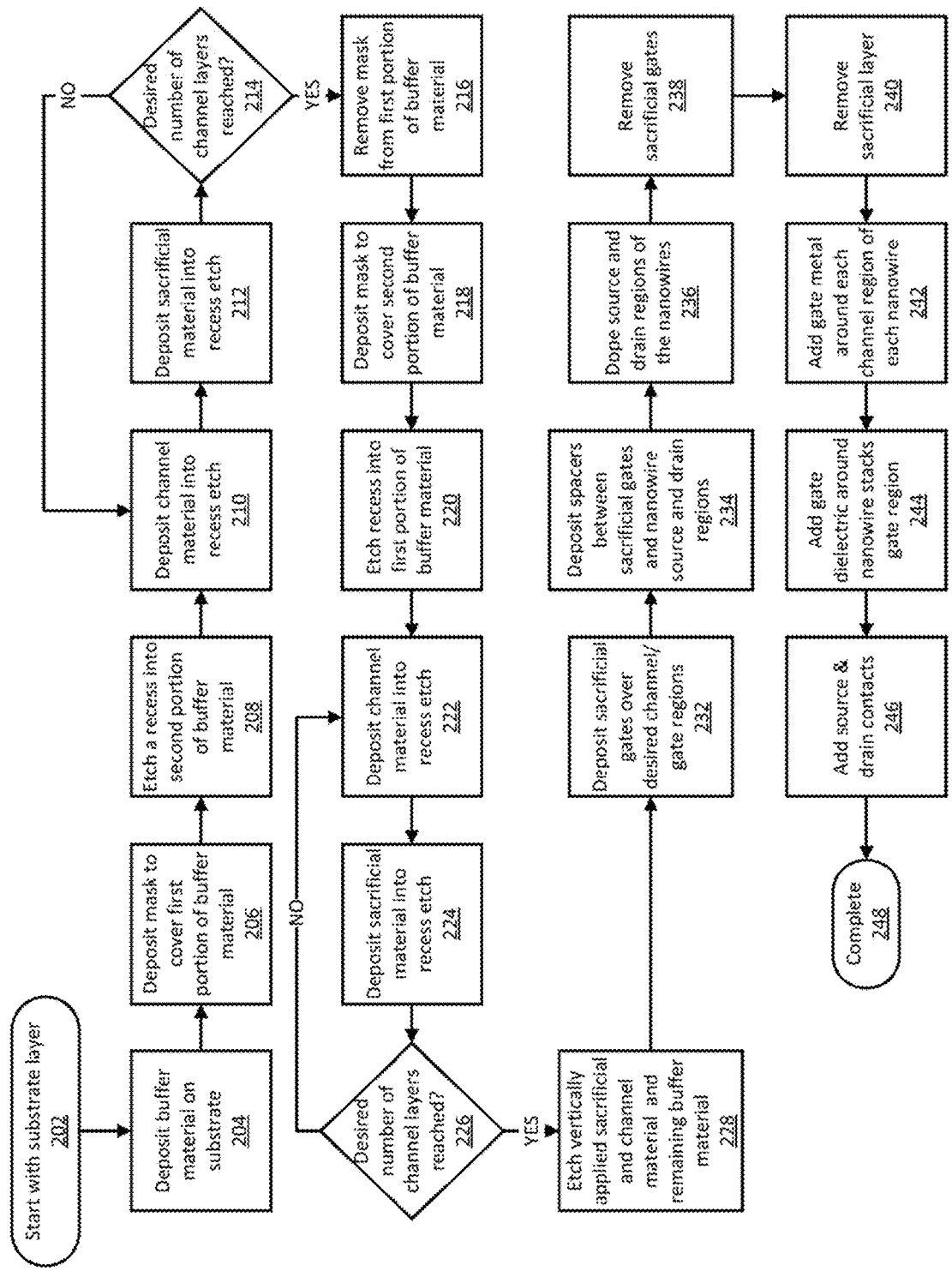
FIG. 2 is a flowchart of an isolated process flow ("IPF") for creating a semiconductor device according to one embodiment of the present disclosure.

FIG. 2 is a flowchart of an IPF for creating a semiconductor device according to one embodiment of the present disclosure. As will be described in detail below, according to a first embodiment of the present disclosure, an IPF may comprise a DWPF. According to a second embodiment of the present disclosure, an IPF may comprise a FFPF. Utilizing an IPF such as DWPF or FFPF allows for the fabrication of individually tunable NMOS and PMOS nanowire stacks by maintaining flat non-faceted nanowires surfaces while decoupling the inherent dependence of PMOS and NMOS geometries and composition constraints imposed by previous fabrication techniques.

Referring to FIG. 2, the process is initiated in 202, whereby substrate 110 is deposited. According to one embodiment of the present disclosure, substrate comprises sSi. In 204, a buffer layer 111 is deposited on substrate 110. In 206, a hard mask material, such as silicon nitride or aluminum oxide is deposited over a first portion of the buffer layer 111. In 208, a first recess is created in a second portion of the buffer layer 111 utilizing an etching process. According to a first embodiment of the present disclosure, the recess comprises a deep-well, which will be utilized in a DWPF.

For purposes of this discussion, it is assumed that a desired number of nanowires (PMOS or NMOS) are to be created in a nanowire stack. Each nanowire stack may then be incorporated into a nanowire transistor, which may comprise multiple nanowire stacks. In order to generate either an NMOS or PMOS nanowire stack using an IPF, according to one embodiment of the present disclosure, in 210-214 a corresponding number of alternating channel layers and sacrificial layers are deposited over buffer layer 111 within the recess created in 208.

According to one embodiment of the present disclosure the channel layer and sacrificial layer material may respectively be sSi or sSiGe with a low concentration of Ge and sSiGe with a high concentration of Ge for an NMOS nanowire transistor. Conversely, the channel layer and sacrificial layer material may respectively be sSiGe with a high concentration of Ge and sSi or sSiGe with a low concentration of Ge for a PMOS nanowire transistor. The first deposited layer in either instance may be a channel layer or a sacrificial layer. According to one embodiment of the present disclosure, an alternating stack of channel layers and sacrificial layers are deposited into the recess created in 208 (for example, using a DWPF). In particular, in 210 a channel material layer is deposited into the recess etch. In 212, a sacrificial material layer is deposited into the recess etch. In 214, it is determined whether a desired number of channel layers have been deposited (i.e., the desired number of nanowires have been created). If not ('No' branch of 214), flow continues with 210 and another channel layer is deposited.

It is assumed for purposes of this discussion that for a given nanowire stack (either NMOS or PMOS), a predetermined number of nanowires are to be created. The number of nanowires created will correspond to the number of channel layers deposited in the recess.

If so ('Yes' branch of 214), flow continues with 216, whereby the hard mask material covering said first portion of the buffer material is removed. In 218, a hard mask material is deposited over the second portion of the buffer material. In 220, a second recess is created in a first portion of the buffer layer 111 utilizing an etching process. According to one embodiment of the present disclosure, the recess comprises a deep-well, which will be utilized in a DWPF.

Steps 222-226 are similar to steps 210-214 for the desired NMOS or PMOS second stack. Note that steps 222 and 224 may be reversed, allowing the sacrificial material to be deposited prior to the channel material. As previously mentioned, according to one embodiment of the present disclosure the channel layer and sacrificial layer material may respectively be sSi or sSiGe with a low concentration of Ge and sSiGe with a high concentration of Ge for an NMOS nanowire transistor. Conversely, the channel layer and sacrificial layer material may respectively be sSiGe with a high concentration of Ge and sSi or sSiGe with a low concentration of Ge for a PMOS nanowire transistor.

As part of the deposition of channel layers and sacrificial layers, some portions of the channel layers and/or sacrificial layers may assume a vertical orientation, which may not be used in an operation manner. Accordingly, in 228, any vertically oriented channel and/or sacrificial material is removed, which results in the channel and sacrificial layer stacks generated in 210-214 and 222-226 to be shaped into "fin" shapes, using, for example, using an isotropic etching process. According to alternative embodiments, other etching processes may be employed. Note that any fin width or gap between fins may be utilized. In 232, sacrificial gate structures, which will be removed later, are deposited around the desired gate region of each fin. According to one embodiment of the present disclosure, the sacrificial gate stacks may comprise thermally grown or deposited silicon oxide and deposited polysilicon. According to some embodiments the sacrificial gate structures are blanket deposited, polished and then lithography is used to pattern the material only to the gate regions of the nanowires.

In 234, spacers 120(1)-120(8) are deposited on the side walls of the sacrificial gates. According to one embodiment of the present disclosure, spacers 120(1)-120(8) isolate the exposed source 102(1)-120(2) and drain regions 104(1)-120(2) from channel regions 106. According to one embodiment of the present disclosure, spacers may comprise silicon nitride or silicon oxynitride. As source 102 and drain 104 regions will be introduced at the ends of the channel material, the isolation provided by spacers 120(1)-120(8) prevents interference with the channel region 106 of the nanowires when the source 102(1)-102(2) and drain regions 104(1)-104(2) are doped.

According to some embodiments, an alternative process step may be performed that removes the sacrificial region under the spacer so the spacer material wraps around the wires.

In 236, source 102 and drain 104 regions are created for each nanowire using a doping process. According to some embodiments, source and drain regions may be formed by etching out the stack in the source/drain regions undercutting the spacer and then epitaxially depositing doped Si, SiGe or Ge. As previously discussed, according to some embodiments of the present disclosure, a stack, or multiple stacks of nanowires may utilize discrete source 102 regions. According to alternative embodiments, a common shared source 102 and drain 104 may be employed.

In 238 the sacrificial gates generated in 232 are removed exposing the channel regions of the nanowires. In 240, the sacrificial layers between the channel layers are removed leaving the channel layers, which will function as nanowires. According to one embodiment of the present disclosure, a wet etching process may be utilized is used to selectively remove the sacrificial material without damaging the channel layer material. According to some embodiments of the present disclosure, dielectric materials fill the source/drain regions above the source/rain epitaxial regions. This may be then polished and the polysilicon gates followed by removing the sacrificial gate oxide. According to some embodiments, N and P stacks may be treated differently.

In 242, a gate metal 122(1)-(6) is deposited in a thin uniform layer on each of the flat non-faceted surfaces of each nanowire channel region 106(1)-(6). In 244, a gate dielectric is deposited over said gate metal deposits, fully encapsulating each NMOS 126 and PMOS 124 nanowire stack.

In 246, source and drain electrodes (108, 118) are created and electrically coupled to the appropriate source 102 and drain 104 regions of the nanowires. According to one embodiment of the present disclosure, source and drain electrodes (108, 118) comprise metal. The process ends in 248.

The ability to tune an NMOS nanowire stack independently of a PMOS nanowire stack with respect to various performance characteristics of the nanowire stacks utilizing an IPF as depicted in FIG. 2 will now be described. As previously noted, using an IPF such as that depicted in FIG. 2, the interdependence between NMOS and PMOS channel and sacrificial material is decoupled allowing engineering of NMOS nanowire characteristics independent of PMOS nanowire characteristics.

For example, utilizing an IPF, PMOS nanowire spacing may be varied independently of NMOS nanowire spacing. In particular, as the sacrificial layers will ultimately be removed, the thickness and composition of the sacrificial material may be manipulated to achieve the desired geometrical properties of nanowires such as nanowire spacing. Because the coupling between sacrificial and channel material is decoupled using an IPF such as that depicted in FIG. 2, NMOS nanowire spacing may be tuned independently of PMOS nanowire spacing due to the fact that the sacrificial layer material's thickness determines the vertical spacing between nanowires in the final stack. For example, if a 5 nm layer of sacrificial material is deposited between two channel layers, then a resulting semiconductor device 100 incorporating the nanowire stack will exhibit 5 nm of vertical space between nanowires. As previously noted, reducing the vertical spacing between nanowires reduces the dead space capacitance between nanowires and improves channel mobility.

As another example, the composition of NMOS nanowires may be varied independently of the composition of the PMOS sacrificial layer composition. Also, PMOS spacing may be decoupled from the NMOS wire thickness.

As yet another example, the geometry of PMOS nanowires may be tuned independently of NMOS nanowires. In particular, the channel material thickness governs the desired size and shape of the nanowire. And the PMOS and NMOS wires geometries are separate from the PMOS and NMOS gaps between the wires. For example, if the optimal is a 5 nm wire thickness and 7 nm is needed for the gap between wires both NMOS and PMOS can be made with these dimensions. NMOS and PMOS do not need to be the same dimensions in this design.

Figure 3F:
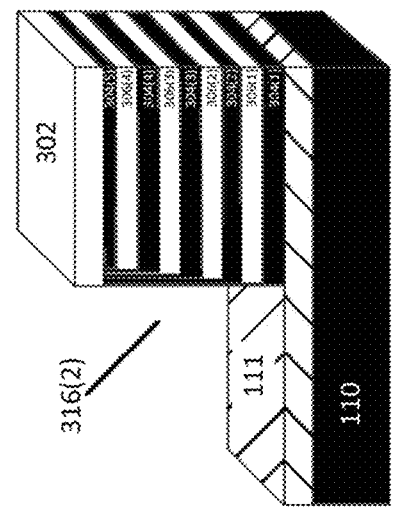
FIG. 3f depicts a sixth portion of a DWPF according to one embodiment of the present disclosure.

FIGS. 3a-3i depict a DWPF according to one embodiment of the present disclosure. As previously discussed, a DWPF is one example embodiment of an IPF. FIG. 3a, depicts a first portion of a DWPF according to one embodiment of the present disclosure. As shown in FIG. 3a, buffer layer 111 is deposited on substrate layer 110. According to one embodiment of the fabrication process, substrate layer 110 comprises Si and buffer layer 111 comprises rSiGe. Note that substrate layer 110 and the buffer layer 111 may be any deposited to any thickness.

As further shown in FIG. 3a, hard mask material 302 is deposited over a first region of the buffer layer 111 that is external to a first deep-well that will be fabricated. According to one embodiment of the present disclosure, hard mask 302 may comprise silicon nitride. The region covered by hard mask 302 is effectively protected and decoupled from any process steps applied to the region not covered by hard mask 302, which itself may undergo any number of process steps such as the deposition of material layers, etching etc. For purposes of the present discussion, the region covered by hard mask 302 will be referred to as a first protected region.

FIG. 3b depicts a second portion of a DWPF according to one embodiment of the present disclosure. As shown in FIG. 3b, an unprotected region of buffer layer 111 (i.e., a region not covered by hard mask 302) is etched in a uniform manner to generate first deep-well 316(1), comprising a recess.

FIG. 3c depicts a third portion of a DWPF according to one embodiment of the present disclosure. As shown in in FIG. 3c, channel layer 304(1) is deposited into first deep-well 316(1). As previously noted, according to one embodiment of the present disclosure, channel layer 304(1) may comprise sSi or sSiGe with a low concentration of Ge for NMOS nanowires and sSiGe with a high concentration of Ge for PMOS nanowires. Channel layer 304(1) may be deposited to any desired thickness to achieve a particular thickness of the nanowires. For purposes of the present disclosure, it is assumed that PMOS nanowires are to be generated in first deep-well 316. Accordingly, it is assumed that channel layer 304(1) and sacrificial layer 306(1) respectively comprise sSiGe and sSi. However, according to alternative embodiments NMOS nanowires may be deposited in first deep-well 316(1).

Figure 3E:
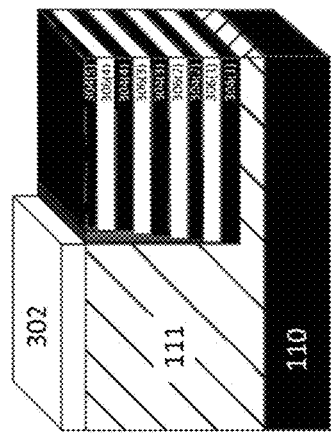
FIG. 3e depicts a fifth portion of a DWPF according to one embodiment of the present disclosure.
Figure 3D:
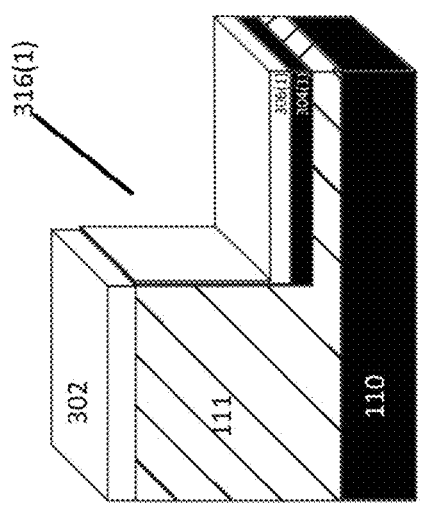
FIG. 3d depicts a fourth portion of a DWPF according to one embodiment of the present disclosure.

FIG. 3d depicts a fourth portion of a DWPF according to one embodiment of the present disclosure. As shown in FIG. 3d, sacrificial layer 306(1) is deposited on the previously deposited channel layer 304(1). According to one embodiment of the present disclosure, sacrificial layer 306(1) may comprise sSiGe with a high concentration of Ge for an NMOS nanowire and sSi or sSiGe with a low concentration of Ge for a PMOS nanowire. In accordance with the previous assumption that PMOS nanowires are generated in first deep-well 316(1), it will be understood that sacrificial layer 306(1) comprises sSi.

FIG. 3e depicts a fifth portion of a DWPF according to one embodiment of the present disclosure. Specifically, FIG. 3e depicts a process state after which a desired number of channel layers 304 and associated sacrificial layers 306 have been deposited in deep-well 316(1). In particular, as shown in FIG. 3e four sacrificial layers (306(1)-306(4)) and five channel layers (304(1)-304(5)) have been deposited in deep-well 316(1). However, it will be understood that any number of alternating sacrificial 306 and channel 304 layers may be deposited. Note that each channel layer 304(1)-304(5) and each sacrificial layer 306(1)-306(4) may assume an arbitrary thickness allowing for the control and tuning of nanowire spacing and thickness. Further, each channel layer 304(1)-304(5) and each sacrificial layer 306(1)-306(4) may assume geometries and material composition independent of sacrificial layers and channel layers that will ultimately be deposited in the first protected region covered by hard shell 302. As previously discussed, because according to this example, first deep-well 316(1) will house PMOS nanowires, it is assumed that sacrificial layers 306(1)-306(4) comprises sSiGe with a high concentration of Ge and channel layers 304(1)-304(5) comprise sSi or sSiGe with a low concentration of Ge.

FIG. 3f depicts a sixth portion of a DWPF according to one embodiment of the present disclosure. As shown in FIG. 3f, hard shell 302 previously using a shield to form a first protected region is removed such that the first protected region is no longer resistant to any material processes performed. The hard mask material 302 is then deposited over the completed PMOS stack. Thus, by virtue of the depositing of hard mask 302, any subsequent applied material processes will not disturb any of the layers in first deep-well 316(1). A second deep-well 316(2) is etched in buffer layer 111. It is assumed for purposes of this discussion that second deep-well 316(2) will house NMOS nanowires. Because second deep-well 316(2) is effectively decoupled from first-deep well 316(1), NMOS nanowire fabrication may be affected independently of the PMOS nanowire fabrication in first deep-well 316(1) allowing for independent tuning of the PMOS nanowires from the NMOS nanowires.

Figure 3G:
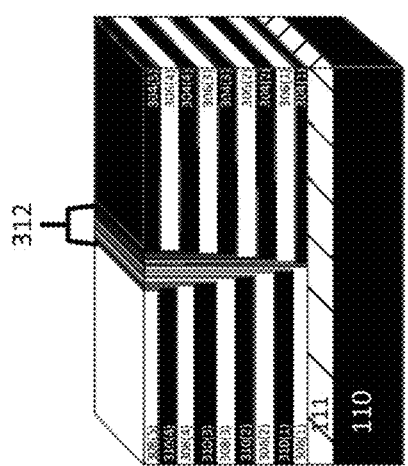
FIG. 3g depicts a seventh portion of a DWPF according to one embodiment of the present disclosure.

FIG. 3g depicts a seventh portion of a DWPF according to one embodiment of the present disclosure. In particular, FIG. 3g depicts a DWPF after a number of alternating sacrificial material layers 310(1)-310(4) and channel layers 308(1)-308(5) have been deposited in second deep-well 316(2). As previously described, for purposes of this example it is assumed that second deep-well 316(2) will house NMOS nanowires. Thus, it is assumed that channel layers 308(1)-308(5) comprise sSi or sSiGe with a low concentration of Ge and sacrificial layers 310(1)-(4) comprise sSiGe with a high concentration of Ge. Because sacrificial layers 310(1)-310(4) and channel layers 308(1)-308(5) are fabricated independently of channel layers 304(1)-304(5) and sacrificial layers 306(1)-306(4) in first deep-well 316(1), the NMOS nanowires in second deep-well 316(2) may be engineered to exhibit geometry, composition and other attributes independent of the attributers of PMOS nanowires in first deep-well 316(1).

Figure 3H:
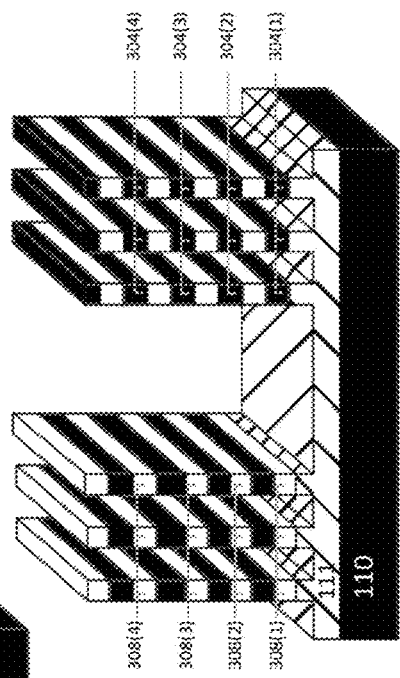
FIG. 3h depicts an eighth portion of a DWPF according to one embodiment of the present disclosure.

FIG. 3h depicts an eighth portion of a DWPF according to one embodiment of the present disclosure. In particular, FIG. 3h depicts a process for etching fin shapes from the layer stacks in first deep-well 316(1) and second deep-well 316(2). In particular, according to one embodiment of the present disclosure, channel layers 308(1)-308(5) and sacrificial layers 310(1)-310(4) in second deep-well 316(2) and sacrificial layers 306(1)-306(4) and channel layers 304(1)-304(5) in first deep-well 316(1) are anisotropically etched into fin shapes, leaving a thin buffer layer 111 of rSiGe between the etches and the substrate 110. The fins can be etched to any width and need not be uniform as shown in FIG. 3h. Although according to this example, an anisotropic etching process is utilized, according to alternative embodiments, other etching processes are possible. For example, according to one embodiment of the present disclosure, a dry etching step (anisotropic) may be utilized to create a straight in profile. Buffer 111 may not be so thin.

Figure 3I:
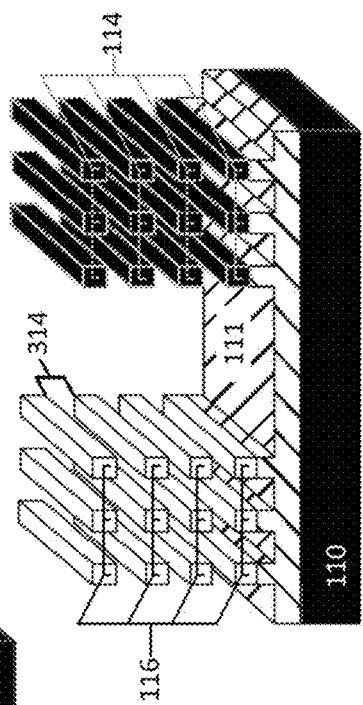
FIG. 3i depicts a between spacer view of the result for a DWPF according to one embodiment of the present disclosure.

FIG. 3i depicts a ninth portion of a DWPF according to one embodiment of the present disclosure. In particular, FIG. 3i depicts a process for removing sacrificial layers 306(1)-306(4) and 310(1)-310(4). According to one embodiment of the present disclosure, a wet etching process is utilized to remove sacrificial layers 306(1)-306(4) and 310(1)-310(4) leaving a respective gap 314 between each channel layer 304(1)-304(4) and 308(1)-308(4). By virtue of the completion of the DWPF shown in FIGS. 3a-3i, channel layers 308(1)-308(4) are rendered to function as tuned uniaxially tensile strained NMOS nanowires 116(1)-116(4) and channel layers 304(1)-304(4) are rendered to function as uniaxially compressive strained PMOS nanowires 114(1)-114(4). Further, NMOS nanowires 116(1)-116(4) have been tuned independently of PMOS nanowires 114(1)-114(4). Note that wet etching is but one embodiment for sacrificial layer removal and other techniques exist for removing sacrificial layers 306(1)-306(4) and 310(1)-310(4)

Performance Improvements

The techniques facilitating independent tuning of NMOS and PMOS nanowire transistor disclosed herein provide for independent tuning enhancement of performance characteristics of these devices, according to some embodiments. For example, as previously mentioned, both NMOS and PMOS dead space capacitance may be independently tuned. As dead space capacitance is inversely proportional to nanowire spacing and directly proportional to carrier mobility, nanowire spacing is inversely proportional to the channel mobility. Thus, by independently varying nanowire spacing in NMOS and PMOS nanowire transistors using the disclosed fabrication processes of either DWPF or FFPF, the channel transport and capacitance can be tuned independently. The sizes, shapes and composition can be tuned independently for NMOS and PMOS wires.

In addition, utilizing an IPF such as DWPF enables independent tuning of the carrier mobility with respect to NMOS and PMOS nanowire transistors. Si is strained by layering it with a relaxed SiGe buffer layer. This causes the atoms of the Si layer to align with the atoms of the SiGe layer which are spaced slightly farther apart. The higher the concentration of Ge the further apart they are spaced. In previous nanowire fabrication processes, a first active layer of Si would be deposited on a relaxed SiGe layer, then a second active layer with a higher concentration of Ge would be deposited over the first active layer. This layering process proceeds until a predefined number of layers have be deposited whereby the newly strained SiGe layers form PMOS nanowires and the newly strained Si layers form NMOS nanowires. Thus, the concentration of Ge in the SiGe had to be large enough to strain the Si layers to create an efficient NMOS device but small enough to also create an efficient PMOS device. In the new fabrication process, because the unwanted active layers are completely etched away, the second active layer need not be a material that would make an effect PMOS transistor. Instead the concentration can be adjusted to maximize the strain, thus, individually tuning each nanowire layer.

Figure 4:
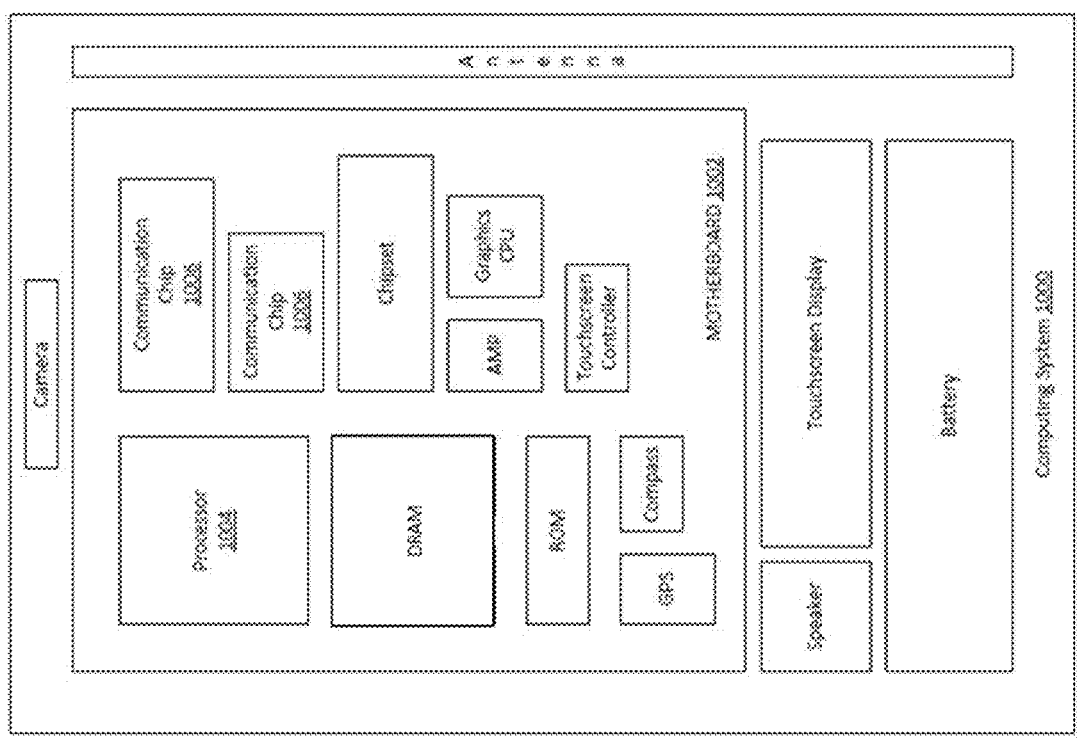
FIG. 4 illustrates a computing system implemented with integrated circuit structures formed using the techniques disclosed herein, in accordance with some embodiments of the present disclosure.

FIG. 4 illustrates a computing system implemented with integrated circuit structures and/or transistor devices formed using the techniques disclosed herein, in accordance with some embodiments of the present disclosure. Computing system 1000 may employ a number of semiconductor device 100 structures as described herein. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more nanowire structures configured in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit nanowire structures configured as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit nanowire structures configured as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit nanowire structures formed using the disclosed techniques, as variously described herein. Note that reference to a computing system is intended to include computing devices, apparatuses, and other structures configured for computing or processing information.

The foregoing description of example embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

FURTHER EXAMPLE EMBODIMENTS

The following examples pertain to further embodiments, from which numerous permutations and configurations will be apparent.

Example 1 is a semiconductor device comprising a substrate, a buffer layer that is compositionally distinct from the substrate at least one strained n-type nanowire above said buffer layer, a first gate structure wrapped around said n-type nanowire, at least one strained p-type nanowire above said buffer layer, a second gate structure wrapped around said p-type nanowire, and, wherein said at least on n-type nanowire and said at least one p-type nanowire exhibit independent geometries with respect to one another.

Example 2 is the semiconductor device according to Example 1, wherein said buffer layer comprises a relaxed layer that includes one or both of silicon and germanium.

Example 3 is the semiconductor device according to any of Examples 1 or 2, wherein the first gate structure includes a first gate electrode and a first dielectric material, and the second gate structure includes a second gate electrode and a second dielectric material, wherein said first dielectric material is between said at least one strained n-type nanowire and said first gate electrode, and wherein said second dielectric material is between said at least one strained p-type nanowire and said second gate electrode.

Example 4 is the semiconductor device according to any of Examples 1-3, further comprising a first source region and a second region. and, a first drain region and a second drain region, wherein said at least one strained n-type nanowire is between said first source region and said first drain region and said at least one strained p-type nanowire is between said second source region and said second drain region.

Example 5 is the semiconductor device according to Example 4, further comprising a first source electrode and a first drain electrode electrically coupled respectively to said first source region and first drain region, a second source electrode and a second drain electrode electrically coupled respectively to said second source region and first drain region.

Example 6 is the semiconductor device according to Example 4, wherein said first source region and first drain region are compositionally distinct from said at least one strained n-type nanowire.

Example 7 is the semiconductor device according to Example 4, wherein said second source region and second drain region are compositionally distinct from said at least one strained p-type nanowire.

Example 8 is a method for fabricating independently tunable NMOS and PMOS nanowire devices comprising depositing a buffer layer over a substrate layer, the buffer layer being compositionally distinct from the substrate layer, etching a first portion of said buffer layer to generate a first recess, alternately depositing at least one channel layer and at least one sacrificial layer in said first recess, to form a first stack, patterning a mask to protect the first stack, etching a second portion of the buffer layer to generate a second recess, alternately depositing at least one channel layer and at least one sacrificial layer in said second recess, to form a second stack, selectively etching said NMOS fin stack to remove at least one said corresponding sacrificial layer, to release one or more NMOS nanowires, selectively etching said PMOS fin stack to remove at least one said sacrificial layer, to release one or more PMOS nanowires.

Example 9 is the method according to Example 8, further comprising prior to etching the first portion of said buffer layer to generate the first recess, depositing a hard mask layer over said second portion of said buffer layer.

Example 10 is the method according to any of Examples 8-9, further comprising prior to etching the second portion of said buffer material to generate a second recess, depositing a hard mask layer over said first portion of said buffer layer.

Example 11 is the method according to any of Examples 8-10, wherein said at least one channel layer and at least one sacrificial layer in said first recess are respectively SiGe and Si.

Example 12 is the method according to any of Examples 8-10, wherein said at least one channel layer and at least one sacrificial layer in said second recess are respectively Si and SiGe.

Example 13 is a digital circuit comprising a substrate, a buffer layer that is compositionally distinct from the substrate, at least one NMOS device, wherein each NMOS device further comprises at least one NMOS nanowire stack comprising at least one strained n-type nanowire above said buffer layer, a first gate structure wrapped around said at least one n-type nanowire, at least one PMOS device, wherein each PMOS device further comprises at least one PMOS nanowire stack, at least one strained p-type nanowire above said buffer layer, a second gate structure wrapped around said at least one p-type nanowire, wherein said at least on n-type nanowire and said at least one p-type nanowire exhibit independent geometries with respect to one another and said at least one NMOS device and at least PMOS device are arranged in a configuration to perform a logic function.

Example 14 is the digital circuit according to Example 13, wherein said buffer layer comprises a relaxed layer that includes one or both of silicon and germanium.

Example 15 is the digital circuit according to any of Examples 13-14, wherein the first gate structure includes a first gate electrode and a first dielectric material, and the second gate structure includes a second gate electrode and a second dielectric material, wherein said first dielectric material is between said at least one strained n-type nanowire and said first gate electrode, and wherein said second dielectric material is between said at least one strained p-type nanowire and said second gate electrode.

Example 16 is the digital circuit according to any of Examples 13-15, further comprising a first source region and a second region, and, a first drain region and a second drain region, wherein said at least one strained n-type nanowire is between said first source region and said first drain region and said at least one strained p-type nanowire is between said second source region and said second drain region.

Example 17 is the digital circuit according to Example 16, further comprising a first source electrode and a first drain electrode electrically coupled respectively to said first source region and first drain region, a second source electrode and a second drain electrode electrically coupled respectively to said second source region and first drain region.

Example 18 is the digital circuit according to any of Examples 16-17, wherein said first source region and first drain region are compositionally distinct from said at least one strained n-type nanowire.

Example 19 is the digital circuit according to any of Examples 16-18, wherein said second source region and second drain region are compositionally distinct from said at least one strained p-type nanowire.

Example 20 is the digital circuit according to any of Examples 13-19, wherein said logic function is one of a NAND function and a NOR function.

What is claimed is:

1. A semiconductor device comprising:
   a substrate;
   a buffer layer that is compositionally distinct from the substrate;
   a plurality of strained n-type nanowires above said buffer layer, wherein immediately neighboring ones of the plurality of strained n-type nanowires are separated by a first vertical distance;
   a first gate structure wrapped around said plurality of strained n-type nanowires;
   a first common source or drain structure at a first side of the first gate structure, the first common source or drain structure in contact with a first lateral end of each of the plurality of strained n-type nanowires;
   a second common source or drain structure at a second side of the first gate structure, the second common source or drain structure in contact with a second lateral end of each of the plurality of strained n-type nanowires;
   a plurality of strained p-type nanowires above said buffer layer, wherein immediately neighboring ones of the plurality of strained p-type nanowires are separated by a second vertical distance different than the first vertical distance, and wherein an uppermost one of the plurality of strained p-type nanowires has an uppermost surface co-planar with an uppermost surface of an uppermost one of the plurality of strained n-type nanowires;
a second gate structure wrapped around said plurality of strained p-type nanowires;
a third common source or drain structure at a first side of the second gate structure, the third common source or drain structure in contact with a first lateral end of each of the plurality of strained p-type nanowires;
a fourth common source or drain structure at a second side of the second gate structure, the fourth common source or drain structure in contact with a second lateral end of each of the plurality of strained p-type nanowires; and
a plurality of spacers disposed on sidewalls of the first and second gate structures, each of the plurality of spacers wraps around the first, second, third and fourth common source or drain structures respectively.

2. The semiconductor device according to claim 1, wherein said buffer layer comprises a relaxed layer that includes one or both of silicon and germanium.

3. The semiconductor device according to claim 1, wherein the first gate structure includes a first gate electrode and a first dielectric material, and the second gate structure includes a second gate electrode and a second dielectric material, wherein said first dielectric material is between said plurality of strained n-type nanowires and said first gate electrode, and wherein said second dielectric material is between said plurality of strained p-type nanowires and said second gate electrode.

4. The semiconductor device according to claim 1, further comprising:
a first source region and a second source region; and,
a first drain region and a second drain region;
wherein said plurality of strained n-type nanowires is between said first source region and said first drain region and said plurality of strained p-type nanowires is between said second source region and said second drain region.

5. The semiconductor device according to claim 4, further comprising a first source electrode and a first drain electrode electrically coupled respectively to said first source region and first drain region, a second source electrode and a second drain electrode electrically coupled respectively to said second source region and said second drain region.

6. The semiconductor device according to claim 4, wherein said first source region and first drain region are compositionally distinct from said plurality of strained n-type nanowires.

7. The semiconductor device according to claim 4, wherein said second source region and second drain region are compositionally distinct from said plurality of strained p-type nanowires.

8. A method for fabricating independently tunable NMOS and PMOS nanowire devices comprising:
depositing a buffer layer over a substrate layer, the buffer layer being compositionally distinct from the substrate layer;
etching a first portion of said buffer layer to generate a first recess;
alternately depositing a plurality of channel layers and at least one sacrificial layer in said first recess, to form a first stack;
patterning a mask to protect the first stack;
etching a second portion of the buffer layer to generate a second recess;
alternately depositing a plurality of channel layers and at least one sacrificial layer in said second recess, to form a second stack;
selectively etching said first stack to remove the at least one sacrificial layer to release two or more NMOS nanowires, wherein immediately neighboring ones of the two or more NMOS nanowires are separated by a first vertical distance;
selectively etching said second stack to remove the at least one sacrificial layer to release two or more PMOS nanowires, wherein immediately neighboring ones of the two or more PMOS nanowires are separated by a second vertical distance different than the first vertical distance, and wherein an uppermost one of the two or more PMOS nanowires has an uppermost surface co-planar with an uppermost surface of an uppermost one of the two or more NMOS nanowires.

9. The method according to claim 8, further comprising prior to etching the first portion of said buffer layer to generate the first recess, depositing a hard mask layer over said second portion of said buffer layer.

10. The method according to claim 8, further comprising prior to etching the second portion of said buffer material to generate a second recess, depositing a hard mask layer over said first portion of said buffer layer.

11. The method according to claim 8, wherein said plurality of channel layers and at least one sacrificial layer in said first recess are respectively SiGe and Si.

12. The method according to claim 8, wherein said plurality of channel layers and at least one sacrificial layer in said second recess are respectively Si and SiGe.

13. A digital circuit comprising:
a substrate;
a buffer layer that is compositionally distinct from the substrate;
at least one NMOS device, wherein each NMOS device further comprises:
at least one NMOS nanowire stack comprising a plurality of strained n-type nanowires above said buffer layer, wherein immediately neighboring ones of the plurality of strained n-type nanowires are separated by a first vertical distance;
a first gate structure wrapped around said plurality of strained n-type nanowires; at least one PMOS device, wherein each PMOS device further comprises:
at least one PMOS nanowire stack comprising a plurality of strained p-type nanowires above said buffer layer, wherein immediately neighboring ones of the plurality of strained p-type nanowires are separated by a second vertical distance different than the first vertical distance, and wherein an uppermost one of the plurality of strained p-type nanowires has an uppermost surface co-planar with an uppermost surface of an uppermost one of the plurality of strained n-type nanowires;
a first common source or drain structure at a first side of the first gate structure, the first common source or drain structure in contact with a first lateral end of each of the plurality of strained n-type nanowires;
a second common source or drain structure at a second side of the first gate structure, the second common source or drain structure in contact with a second lateral end of each of the plurality of strained n-type nanowires;
a second gate structure wrapped around said plurality of strained p-type nanowires;

wherein said at least one NMOS device and at least PMOS device are arranged in a configuration to perform a logic function;

a third common source or drain structure at a first side of the second gate structure, the third common source or drain structure in contact with a first lateral end of each of the plurality of strained p-type nanowires;

a fourth common source or drain structure at a second side of the second gate structure, the fourth common source or drain structure in contact with a second lateral end of each of the plurality of strained p-type nanowires; and a plurality of spacers disposed on sidewalls of the first and second gate structures, each of the plurality of spacers wraps around the first, second, third and fourth common source or drain structures respectively.

14. The digital circuit according to claim 13, wherein said buffer layer comprises a relaxed layer that includes one or both of silicon and germanium.

15. The digital circuit according to claim 13, wherein the first gate structure includes a first gate electrode and a first dielectric material, and the second gate structure includes a second gate electrode and a second dielectric material, wherein said first dielectric material is between said plurality of strained n-type nanowires and said first gate electrode, and wherein said second dielectric material is between said plurality of strained p-type nanowires and said second gate electrode.

16. The digital circuit according to claim 13, further comprising:
a first source region and a second source region; and
a first drain region and a second drain region;
wherein plurality of strained n-type nanowires is between said first source region and said first drain region, and said plurality of strained p-type nanowires is between said second source region and said second drain region.

17. The digital circuit according to claim 16, further comprising a first source electrode and a first drain electrode electrically coupled respectively to said first source region and first drain region, a second source electrode and a second drain electrode electrically coupled respectively to said second source region and said second drain region.

18. The digital circuit according to claim 16, wherein said first source region and first drain region are compositionally distinct from said plurality of strained n-type nanowires.

19. The digital circuit according to claim 16, wherein said second source region and second drain region are compositionally distinct from said plurality of strained p-type nanowires.

20. The digital circuit according to claim 13, wherein said logic function is one of a NAND function and a NOR function.

21. The semiconductor device according to claim 1, wherein a bottommost one of the plurality of strained p-type nanowires has a bottommost surface co-planar with a bottommost surface of a bottommost one of the plurality of strained n-type nanowires.

22. A semiconductor device comprising:
a substrate;
a buffer layer that is compositionally distinct from the substrate;
a plurality of strained n-type nanowires above said buffer layer, wherein immediately neighboring ones of the plurality of strained n-type nanowires are separated by a first vertical distance;
a first gate structure wrapped around said plurality of strained n-type nanowires;
a first common source or drain structure at a first side of the first gate structure, the first common source or drain structure in contact with a first lateral end of each of the plurality of strained n-type nanowires;
a second common source or drain structure at a second side of the first gate structure, the second common source or drain structure in contact with a second lateral end of each of the plurality of strained n-type nanowires;
a plurality of strained p-type nanowires above said buffer layer, wherein immediately neighboring ones of the plurality of strained p-type nanowires are separated by a second vertical distance different than the first vertical distance, and wherein a bottommost one of the plurality of strained p-type nanowires has a bottommost surface co-planar with a bottommost surface of a bottommost one of the plurality of strained n-type nanowires;
a second gate structure wrapped around said plurality of strained p-type nanowires;
a third common source or drain structure at a first side of the second gate structure, the third common source or drain structure in contact with a first lateral end of each of the plurality of strained p-type nanowires;
a fourth common source or drain structure at a second side of the second gate structure, the fourth common source or drain structure in contact with a second lateral end of each of the plurality of strained p-type nanowires; and
a plurality of spacers disposed on sidewalls of the first and second gate structures, each of the plurality of spacers wraps around the first, second, third and fourth common source or drain structures respectively.

* * * * *